United States Patent
Nicol (10) Patent No.: US 10,374,605 B2
(45) Date of Patent: *Aug. 6, 2019

(54) LOGICAL ELEMENTS WITH SWITCHABLE CONNECTIONS IN A RECONFIGURABLE FABRIC

(71) Applicant: Wave Computing, Inc., Campbell, CA (US)

(72) Inventor: Christopher John Nicol, Campbell, CA (US)

(73) Assignee: Wave Computing, Inc., Campbell, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/176,922

(22) Filed: Oct. 31, 2018

(65) Prior Publication Data

US 2019/0074836 A1    Mar. 7, 2019

Related U.S. Application Data

(63) Continuation-in-part of application No. 15/443,612, filed on Feb. 27, 2017, now Pat. No. 10,218,357.
(Continued)

(51) Int. Cl.
*H03K 19/0175* (2006.01)
*H03K 19/177* (2006.01)

(52) U.S. Cl.
CPC . *H03K 19/017581* (2013.01); *H03K 19/1776* (2013.01); *H03K 19/17764* (2013.01)

(58) Field of Classification Search
CPC ....... H03K 19/17728; H03K 19/17704; H03K 19/1733; H03K 19/17736; H03K 19/1737;
(Continued)

(56) References Cited

U.S. PATENT DOCUMENTS 6,134,605 A    10/2000 Hudson et al.
6,363,470 B1    3/2002 Laurenti et al.
(Continued)

FOREIGN PATENT DOCUMENTS

JP    2005165961 A    12/2003
WO    WO2009131569 A1    10/2009

OTHER PUBLICATIONS

International Search Report dated Feb. 6, 2015 for PCT/US2014/063591.

*Primary Examiner* — Seokjin Kim
(74) *Attorney, Agent, or Firm* — Adams Intellex, PLC (57) ABSTRACT

Techniques are disclosed for designing a reconfigurable fabric. The reconfigurable fabric is designed using logical elements, configurable connections between and among the logical elements, and rotating circular buffers. The circular buffers contain configuration instructions. The configuration instructions control connections between and among logical elements. The logical elements change operation based on the instructions that rotate through the circular buffers. Clusters of logical elements are interconnected by a switching fabric. Each cluster contains processing elements, storage elements, and switching elements. A circular buffer within a cluster contains multiple switching instructions to control the flow of data throughout the switching fabric. The circular buffer provides a pipelined execution of switching instructions for the implementation of multiple functions. Each cluster contains multiple processing elements, and each cluster further comprises an additional circular buffer for each processing element. Logical operations are controlled by the circular buffers.

24 Claims, 9 Drawing Sheets

Related U.S. Application Data which is a continuation-in-part of application No. 14/530,624, filed on Oct. 31, 2014, now Pat. No. 9,590,629.

(60) Provisional application No. 61/899,180, filed on Nov. 2, 2013.

(58) Field of Classification Search
CPC .......... H03K 19/1776; H03K 19/17744; G06F 17/5054
See application file for complete search history.

(56) References Cited

U.S. PATENT DOCUMENTS

| | | | |
|---|---|---|---|
| 7,102,391 B1* | 9/2006 | Sun | G01K 7/015 327/10 |
| 7,193,994 B1 | 3/2007 | Payson | |
| 8,314,636 B2 | 11/2012 | Hutton et al. | |
| 8,341,469 B2 | 12/2012 | Miyama et al. | |
| 8,908,709 B1 | 12/2014 | Aybay | |
| 9,627,496 B2 | 4/2017 | Masuoka et al. | |
| 2007/0133399 A1 | 6/2007 | Gangwal | |
| 2009/0089605 A1 | 4/2009 | Westwick et al. | |
| 2010/0013517 A1 | 1/2010 | Manohar et al. | |
| 2010/0281448 A1 | 11/2010 | He | |
| 2011/0199117 A1 | 8/2011 | Hutchings et al. | |
| 2012/0119781 A1 | 5/2012 | Manohar et al. | |
| 2012/0193621 A1* | 8/2012 | Or-Bach | H03K 19/17736 257/48 |
| 2012/0235839 A1 | 9/2012 | Mazumdar et al. | |
| 2012/0319730 A1 | 12/2012 | Fitton et al. | |
| 2013/0009666 A1 | 1/2013 | Hutton et al. | |
| 2013/0009667 A1 | 1/2013 | Calhoun et al. | |
| 2013/0043902 A1 | 2/2013 | Rahim et al. | |
| 2013/0339778 A1 | 12/2013 | Smentek et al. | |
| 2014/0075144 A1 | 3/2014 | Sanders et al. | |
| 2016/0197615 A1* | 7/2016 | Oda | H03K 19/1737 326/41 |

\* cited by examiner

LOGICAL ELEMENTS WITH SWITCHABLE CONNECTIONS IN A RECONFIGURABLE FABRIC

RELATED APPLICATION

This application is a continuation-in-part of U.S. patent application "Logical Elements with Switchable Connections for Multifunction Operation" Ser. No. 15/443,612, filed Feb. 27, 2017.

The U.S. patent application "Logical Elements with Switchable Connections for Multifunction Operation" Ser. No. 15/443,612, filed Feb. 27, 2017 is a continuation-in-part of U.S. patent application "Logical Elements with Switchable Connections" Ser. No. 14/530,624, filed Oct. 31, 2014, which claims the benefit of U.S. provisional patent application "Logical Elements with Switchable Connections" Ser. No. 61/899,180, filed Nov. 2, 2013.

Each of the foregoing applications is hereby incorporated by reference in its entirety.

FIELD OF ART

This application relates generally to logic circuitry and more particularly to logical elements with switchable connections for multifunction operation.

BACKGROUND

Semiconductor devices are vastly complex structures. Various semiconductors, including application specific integrated circuits (ASICs), are designed with a certain purpose in mind. As a downside of the specific design parameters of an ASIC, the circuit can no longer be altered after it leaves the production line. For this reason, ASIC designers need to be sure of their chosen design, especially when producing large quantities of the same ASIC. In contrast, a programmable logic device such as a field programmable gate array (FPGA) is a type of semiconductor that does not have specific programming built into the design during production. Programmable logic devices can often be reprogrammed while remaining in their environment of use (e.g. while mounted on the circuit board within which the device is intended to function). Programmable logic devices typically include logic blocks (e.g. programmable Boolean logic gates) and can also include programmable memory blocks, programmable clocking blocks, and other specialized programmable blocks such as multiplier blocks and I/O ports.

Typically, programmable logic devices are programmed using a programming language that implements specific, desired logic in the programmable logic devices. The programmable logic devices can be programmed by writing data to storage on the programmable logic devices. A programmable logic device's architecture includes a programmable routing structure and an array of configurable logic blocks. The programmable routing matrix includes the ability to connect multiple configurable logic blocks to each other.

Programmable logic devices allow for adaptability to future (unforeseen) changes in functional requirements. In some cases, programmable logic devices are used as prototypes for ASIC or other devices. Using a programmable logic device to prototype an ASIC for verification and initial software development is a useful way to both decrease development time and reduce the risk of first silicon failure for the ASIC. Programmable logic devices function well in many applications such as digital video, graphics processing, communications, encryption, medical equipment, mobile computing, and instrumentation, areas all of which are continuing to play an important role in the implementation of many new programmable logic designs.

SUMMARY

Techniques are disclosed for designing a reconfigurable fabric. The reconfigurable fabric is designed using logical elements, configurable connections between the logical elements, and rotating circular buffers. The circular buffers contain configuration instructions. The configuration instructions control connections between logical elements. The logical elements change operation based on the instructions that rotate through the circular buffers. Logical elements, including processing elements, storage elements, and switching elements, are arranged into clusters. Clusters are arranged in groups interconnected by a structure referred to as a switching fabric. The switching fabric includes logical elements such as switching elements. Each cluster contains circular buffers which include configuration instructions for the cluster. The instructions within a circular buffer allow the switching elements to be controlled. The instructions within the buffer reconfigure the logical elements, thus allowing for a dynamic programmable logic device.

A computer-implemented method of designing a reconfigurable fabric is disclosed comprising: implementing a plurality of logical elements; connecting configurable connections between and among the plurality of logical elements; and implementing a plurality of rotating circular buffers residing on a semiconductor chip where the plurality of rotating circular buffers contain configuration instructions which control different configurable connections between and among the plurality of logical elements and dynamically change operation of the logical elements based on the rotating of a circular buffer within the plurality of rotating circular buffers. In embodiments, the rotating of the circular buffer within the plurality of rotating circular buffers enables two or more logical functions to be implemented in run time. In embodiments, the configuration instructions are preprocessed by a compiler and statically scheduled to avoid collisions among the plurality of logical elements. In embodiments, preprocessing inserts further instructions to prevent the collisions. Some embodiments comprise replacing multiple instructions with a single fan-in instruction in preprocessing.

The features, aspects, and advantages of various embodiments will become more apparent from the further description that follows.

BRIEF DESCRIPTION OF THE DRAWINGS

The following detailed description of certain embodiments may be understood by referencing the following figures wherein.

DETAILED DESCRIPTION

Programmable logic devices such as FPGAs have wide applicability due to their flexibility and ability to be reprogrammed within their operating environment. While an FPGA can be reprogrammed, a given program only allows the FPGA to remain in a certain logical arrangement to accomplish a specific logic task or function. The specific logic function is applied to the FPGA at load time, and then is carried out by the FPGA during run time. So for example, if the FPGA is loaded with code to implement a certain function within a certain portion of the FPGA, the function of that portion does not change until the FPGA is reprogrammed. Therefore, while many elemental logic functions can be programmed during load time within the FPGA, the FPGA itself performs only one function per load. For example, an FPGA can be programmed to have an overall function of a DDR DRAM memory controller. While different portions of the FPGA perform different elemental logic functions—such as address generation or dataflow control—the FPGA can only function as a DDR memory controller until a new program is loaded, which takes a relatively long time. The address generation logic does not become data flow control during run time, but only if the FPGA were to be programmed during load time to become a new function. FPGA load time is often measured in seconds or minutes, unlike run time, which is often measured in nanoseconds or picoseconds. In contrast, embodiments disclosed herein provide an improved programmable logic device capable of executing a series of logic operations by dynamic reconfiguration using instructions stored in a circular buffer. For example, one program can be stored in the circular buffer that is attached to logical elements. As the circular buffer rotates, different instructions from the stored program are executed, allowing the logical elements and interconnections to perform two or more functions or operations based on the instructions in the circular buffer without changing programs.

Embodiments disclosed herein provide clusters of logical elements. The logical elements can include processing elements, storage elements, and switching elements. The processing elements can also include processor cores capable of executing machine instructions. The storage elements can include registers, caches, and/or on-chip memories. The switching elements can include bus control circuits, which can be configured to route data on a bus from one cluster to another.

Figure 1:
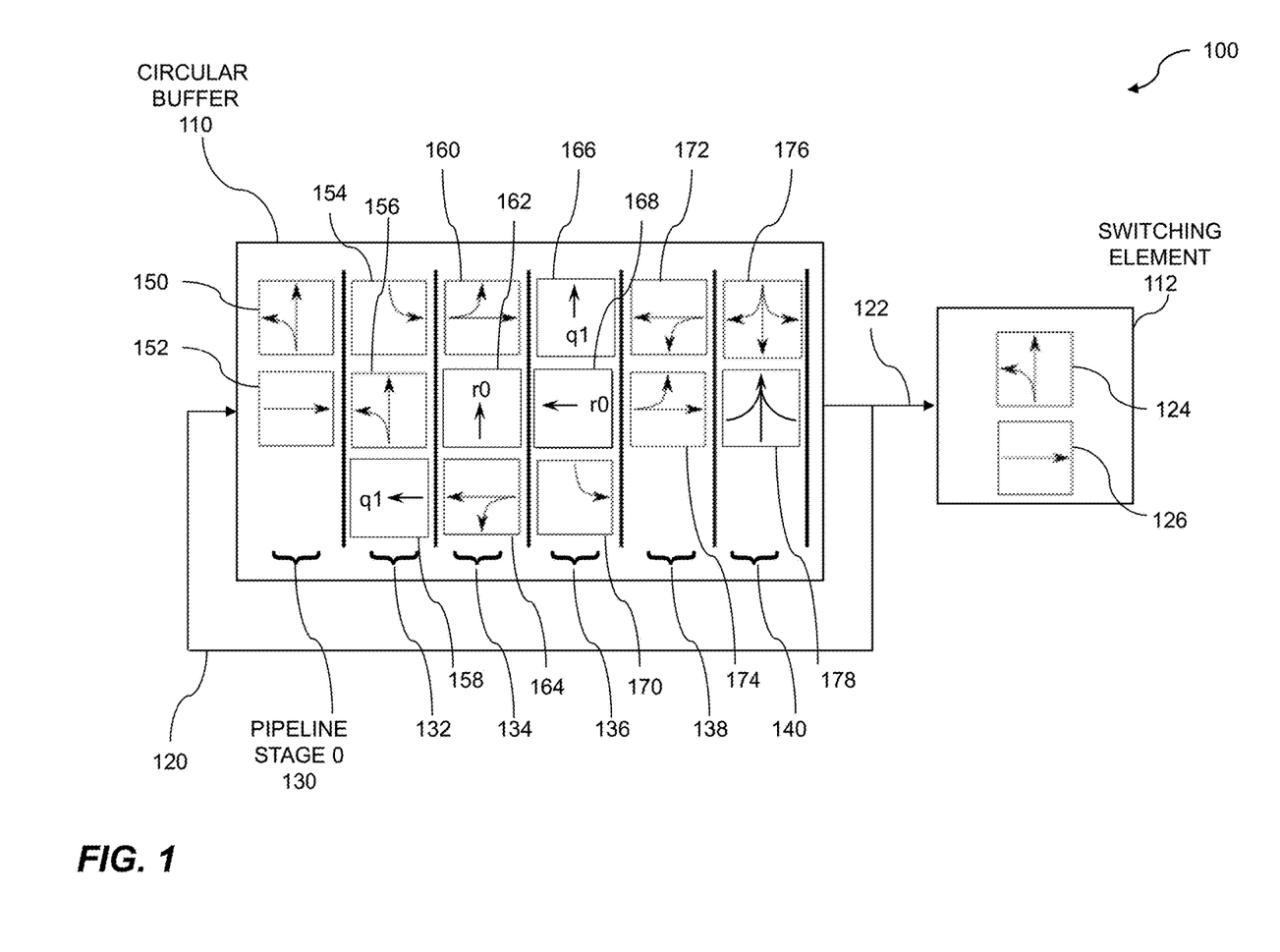
FIG. 1 is a block diagram of a circular buffer.

FIG. 1 is a block diagram 100 of a circular buffer 110 and a corresponding switching element 112. The block diagram 100 describes an apparatus for data manipulation. The circular buffer 110 contains a plurality of pipeline stages. Each pipeline stage contains one or more instructions, up to a maximum instruction depth. In the embodiment shown in FIG. 1, the circular buffer 110 is a 6×3 circular buffer, meaning that it implements a six stage pipeline with an instruction depth of up to three instructions per stage (column). Hence, the circular buffer 110 can include one, two, or three switch instruction entries per column. In some embodiments, the plurality of switch instructions per cycle can comprise two or three switch instructions per cycle. However, in certain embodiments, the circular buffer 110 supports only a single switch instruction in a given cycle. In the example 100 shown, Pipeline Stage 0 130 has an instruction depth of two instructions 150 and 152. Though the remaining pipeline stages 1-5 are not textually labeled in the FIG. 100, the stages are indicated by callouts 132, 134, 136, 138, and 140. Pipeline stage 1 132 has an instruction depth of three instructions 154, 156, and 158. Pipeline stage 2 134 has an instruction depth of three instructions 160, 162, and 164. Pipeline stage 3 136 also has an instruction depth of three instructions 166, 168, and 170. Pipeline stage 4 138 has an instruction depth of two instructions 172 and 174. Pipeline stage 5 140 has an instruction depth of two instructions 176 and 178. In embodiments, the circular buffer 110 includes 64 columns.

During operation, the circular buffer 110 rotates through configuration instructions. The circular buffer 110 can dynamically change operation of the logical elements based on the rotation of the circular buffer. The circular buffer 110 can comprise a plurality of switch instructions per cycle for the configurable connections.

The instruction 152 is an example of a switch instruction. In embodiments, each cluster has four inputs and four outputs, each designated within the cluster's nomenclature as "north," "east," "south," and "west" respectively. For example, the instruction 152 in the block diagram 100 is a west-to-east transfer instruction. The instruction 152 directs the cluster to take data on its west input and to send out the data on its east output. In another example of data routing, the instruction 150 is a fan-out instruction. The instruction 150 instructs the cluster to take data on its south input and to send out the data on both its north output and its west output. The arrows within each instruction box indicate the source and destination of the data. The instruction 178 is an example of a fan-in instruction. The instruction 178 takes data from the west, south, and east inputs and sends out the data via the north output. Therefore, the configurable connections can be considered to be time multiplexed.

In embodiments, the clusters implement multiple storage elements in the form of registers. In the example 100 shown, the instruction 162 is a local storage instruction. The instruction 162 takes data from the instruction's south input and stores it in a register (r0). The instruction 168 is a retrieval instruction. The instruction 168 takes data from the register (r0) and outputs it on the instruction's west output. Some embodiments utilize four general purpose registers, referred to as registers r0, r1, r2, and r3. In embodiments, the registers are storage elements which house data while the configurable connections are busy transferring other data. In embodiments, the storage elements are either 32-bit or 64-bit registers, though other register widths are possible.

In embodiments, the clusters implement multiple processing elements in the form of processor cores, referred to as cores q0, q1, q2, and q3. In embodiments, four cores are used, though any number of cores can be implemented. The instruction 158 is a processing instruction. The instruction 158 takes data from the instruction's east input and sends it to processor q1 for processing. The processors can perform logic operations on the data, including, but not limited to, a shift operation, a logical AND operation, a logical OR operation, a logical NOR operation, a logical XOR operation, an addition, a subtraction, a multiplication, and a division. Thus, the configurable connections can comprise one or more of a fan-in, a fan-out, or a local storage register.

In the example 100 shown, the circular buffer 110 rotates instructions in each pipeline stage both into switching element 112 via a forward data path 122, and also back to a pipeline stage 0 130 via a feedback data path 120. Instructions can include switching instructions, storage instructions, and processing instructions, among others. The feedback data path 120 can allow instructions within the switching element 112 to be transferred back to the circular buffer. Hence, the instructions 124 and 126 in the switching element 112 can also be transferred back to pipeline stage 0 as the instructions 150 and 152. In addition to the instructions depicted on FIG. 1, a no-op instruction or a sleep instruction can also be inserted into a pipeline stage. In embodiments, a no-op instruction prevents execution from being performed for a given cycle. In effect, the introduction of a no-op instruction can cause a column within the circular buffer 110 to be skipped in a cycle. In contrast, not skipping an operation indicates that a valid instruction is being pointed to in the circular buffer. A sleep state can be achieved by not applying a clock to a circuit, performing no processing within a processor, removing a power supply voltage or bringing a power supply to ground, storing information in a non-volatile memory for future use and then removing power applied to the memory, or by similar techniques. A sleep instruction that prevents execution from being performed until a predetermined event occurs, causing the logical element to exit the sleep state, can also be explicitly specified. The predetermined event can be the arrival or availability of valid data. The data can be determined to be valid using null convention logic (NCL). In embodiments, only valid data can flow through the switching elements and Xs (invalid data points) are not propagated by instructions.

In some embodiments, the sleep state is exited based on an instruction applied to a switching fabric. The sleep state can, in some embodiments, only be exited by a stimulus that is external to the logical element and not based on the programming of the logical element. The external stimulus can include an input signal, which in turn can cause a wake up or an interrupt service request to be executed on one or more of the logical elements. An example of such a wake up request can be seen in the instruction 158, assuming that the processor q1 was previously in a sleep state. In embodiments, when the instruction 158 takes valid data from the east input and applies that data to the processor q1, the processor q1 wakes up and operates on the received data. In the event that the data is not valid, the processor q1 can remain in a sleep state. At a later time, data can be retrieved from the q1 processor, e.g. by using an instruction such as the instruction 166. In the case of the instruction 166, data from the processor q1 is moved to the north output. In some embodiments, if Xs are placed into the processor q1, such as during the instruction 158, then Xs are retrieved from the processor q1 during the execution of the instruction 166 and applied to the north output of the instruction 166. In embodiments, the processing element wakes up from the sleep state when valid data is applied to inputs of the processing element.

A collision occurs if multiple instructions route data to a particular port in a given pipeline stage. For example, if instructions 152 and 154 are in the same pipeline stage, they will both send data to the east output at the same time, causing a collision since neither instruction is part of a time-multiplexed fan-in instruction (such as the instruction 178). To avoid potential collisions, certain embodiments use preprocessing, such as by a compiler, to arrange the instructions in such a way as to prevent collisions when the instructions are loaded into the circular buffer. In embodiments, the preprocessing can insert further instructions to prevent collisions. Thus, the circular buffer 110 can be statically scheduled in order to prevent data collisions. In embodiments, when the preprocessor detects an imminent data collision, the scheduler changes the order of the instructions to prevent the collision. Alternatively or additionally, the preprocessor can insert further instructions such as storage instructions (e.g. the instruction 162), sleep instructions, or no-op instructions, to prevent the collision. Alternatively or additionally, the preprocessor can replace multiple instructions with a single fan-in instruction. For example, if a first instruction sends data from the south input to the north output and a second instruction sends data from the west input to the north output in the same pipeline stage, the first and second instruction can be replaced with a fan-in instruction that routes the data from both of those inputs to the north output in a deterministic way to avoid a data collision. In this case, the machine can guarantee that valid data is only applied on one of the inputs for the fan-in instruction.

In embodiments, an apparatus for data manipulation comprising: a plurality of logical elements; configurable connections between and among the plurality of logical elements; and a plurality of rotating circular buffers residing on a semiconductor chip where the plurality of circular buffers contain configuration instructions which control different configurable connections between and among the plurality of logical elements and dynamically change operation of the logical elements based on the rotating of a circular buffer within the plurality of rotating circular buffers, wherein the rotating of the circular buffer within the plurality of rotating circular buffers enables two or more logic functions to be implemented in run time.

Figure 2:
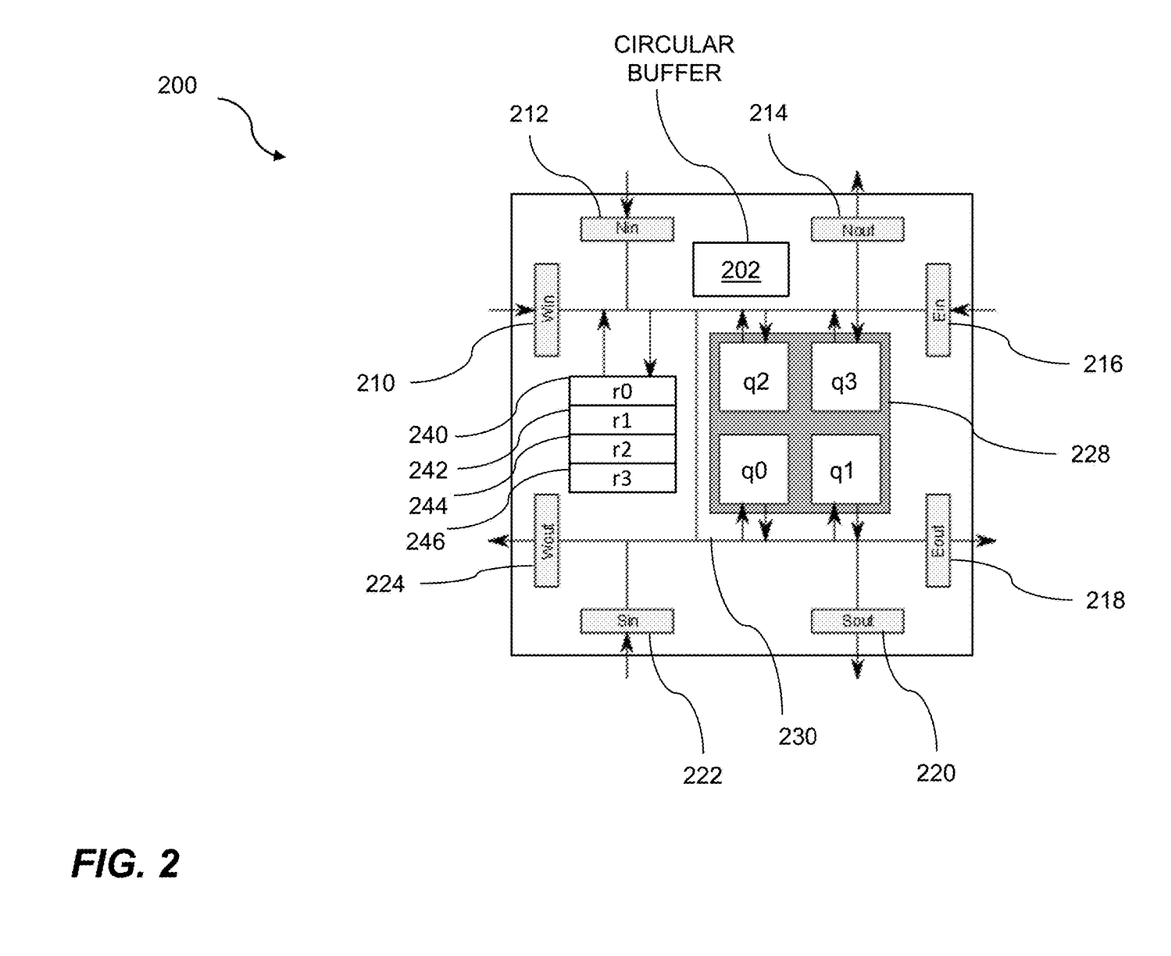
FIG. 2 is an example cluster for course-grained reconfigurable processing.

FIG. 2 is an example cluster 200 for course-grained reconfigurable processing. The cluster 200 comprises a circular buffer 202, which operates similarly to the circular buffer 110 of FIG. 1. The circular buffer 202 can be referred to as a main circular buffer or a switch-instruction circular buffer. In some embodiments, the cluster 200 comprises additional circular buffers corresponding to processing elements within the cluster. The additional circular buffers can be referred to as processor instruction circular buffers. The example cluster 200 comprises a plurality of logical elements, configurable connections between and among the logical elements, and a circular buffer 202 controlling the configurable connections. The logical elements can further comprise one or more of switching elements, processing elements, or storage elements. The example cluster 200 also comprises four processing elements (q0, q1, q2, and q3). The four processing elements can collectively be referred to as a "quad," and are jointly indicated by a grey reference box 228. In embodiments, there is intercommunication among each of the four processing elements. In embodiments, the circular buffer 202 controls the passing of data to the quad of processing elements 228 through switching elements. In embodiments, the four processing elements 228 comprise a processing cluster. In some cases, the processing elements can be placed into a sleep state. In embodiments, the processing elements wake up from a sleep state when valid data is applied to the inputs of the processing elements. In embodiments, the individual processors of a processing cluster share data and/or instruction caches. The individual processors of a processing cluster can implement message passing via a bus or shared memory interface. Power gating can be applied to one or more processors (e.g. q1) in order to reduce power. In embodiments, the circular buffer within the plurality of rotating circular buffers controls the passing of data to a quad of processing elements through switching elements, where each of the quad of processing elements is controlled by four other circular buffers. Data is passed back through the switching elements from the quad of processing elements where the switching elements are again controlled by the circular buffer within the plurality of rotating circular buffers.

The cluster 200 can further comprise storage elements coupled to the configurable connections. As shown, the cluster 200 comprises four storage elements—r0 240, r1 242, r2 244, and r3 246. The cluster 200 further comprises a north input (Nin) 212, a north output (Nout) 214, an east input (Ein) 216, an east output (Eout) 218, a south input (Sin) 222, a south output (Sout) 220, a west input (Win) 210, and a west output (Wout) 224. The circular buffer 202 can contain switch instructions that implement configurable connections. For example, an instruction such as the instruction 160 in FIG. 1 effectively connects the west input 210 with the north output 214 and the east output 218 and this routing is accomplished via bus 230. The cluster 200 can further comprise a plurality of circular buffers residing on a semiconductor chip where the plurality of circular buffers controls unique, configurable connections between and among the logical elements.

As stated previously, the preprocessor can be configured to prevent data collisions within the circular buffer 202. The prevention of collisions can be accomplished by inserting no-op or sleep instructions into the circular buffer (pipeline). Alternatively, in order to prevent a collision on an output port, intermediate data can be stored in registers for one or more pipeline cycles before being sent out through the output port. In embodiments, collisions are avoided by intermediate data being stored in registers for pipeline cycles before being sent to an output port for a cluster.

In other situations the preprocessor can change one switching instruction to another switching instruction to avoid a conflict. For example, in some instances the preprocessor can change an instruction placing data on the west output 224 to an instruction placing data on the south output 220, such that the data can be output on both output ports within the same pipeline cycle. In a case where data needs to travel to a cluster that is both south and west of the cluster 200, it can be more efficient to send the data directly to the south output port rather than to store the data in a register and then send the data to the west output on a subsequent pipeline cycle.

Figure 3:
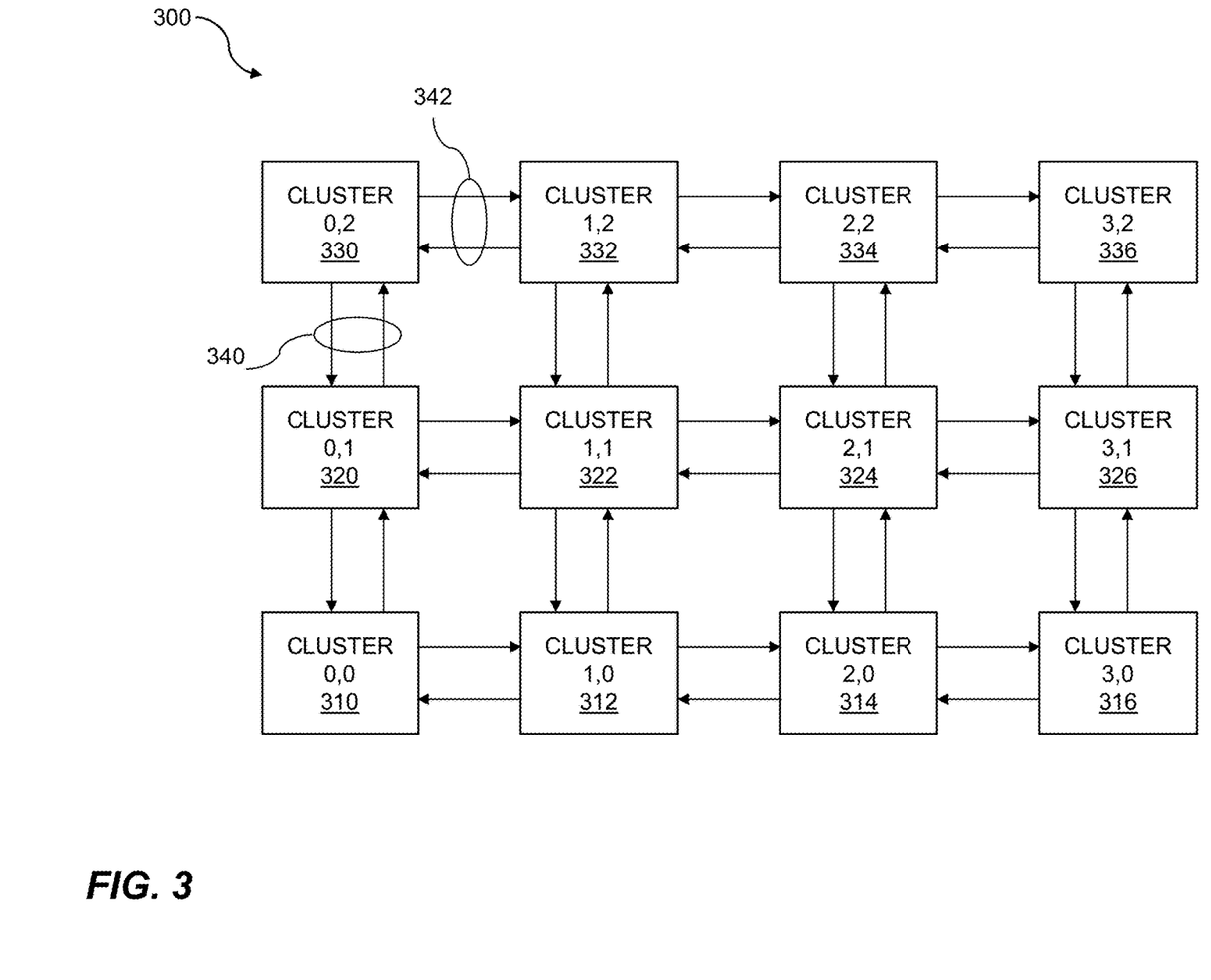
FIG. 3 shows an example fabric of clusters.

FIG. 3 shows an example diagram 300 indicating an example fabric of clusters. A cluster 330 has a cluster 332 to its east and a cluster 320 to its south. The cluster 330 exchanges data 340 with the southerly cluster 320 by using a south output connected to a north input of the cluster 320. Similarly, a south input of the cluster 330 is connected to a north output of the cluster 320. The cluster 330 exchanges data 342 with the cluster 332 oriented to the first cluster's west by using an east output connected to a west input of the second cluster 332. Similarly, an east input of cluster 330 is connected to a west output of cluster 332. In embodiments, the switching fabric is implemented with a parallel bus, such as a 32-bit bus. Other bus widths are possible, including, but not limited to, 16-bit, 64-bit, and 128-bit buses. Therefore, the configurable connections can provide for routing of a plurality of signals in parallel. In embodiments, the plurality of signals comprises four bytes. Communication through the configurable connections can be based on data being valid.

The fabric of clusters shown in FIG. 3 is a two-dimensional (2D) fabric, illustrating a mesh interconnection network where the clusters are placed in a two-dimensional grid. Each cluster is connected to its immediate neighbors as described in the case of the previously mentioned clusters as well as other clusters 310, 312, 314, 316, 322, 324, 326, 334, and 336. Hence, in embodiments, the switching fabric is used in mesh computing. Other embodiments have a fabric of more than two dimensions. The configurable connections can provide three-dimensional routing. A three-dimensional (3D) embodiment can have additional cluster interconnectivity. In one embodiment, the 3D fabric is formed by layering multiple 2D mesh interconnect fabrics. The three-dimensional routing can include accessing a stacked chip. The stacked chip can be a 3D-integrated circuit where multiple die are stacked and interconnected with through-silicon vias. In the case of three-dimensional routing, each cluster can have additional input and output ports. For example, in addition to the north, south, east, and west I/O ports, sets of up and down I/O ports can be present in each cluster to allow connectivity to clusters situated above and below a certain cluster. In embodiments, the configurable connections comprise a switching fabric that is attached to a plurality of processing elements. The configurable connections can route through one or more of silicon vias, two-dimensional connections, three-dimensional connections, or greater than three-dimensional connections.

For example, a setup such as a hypercube can allow for greater than three-dimensional interconnectivity. With n-dimensional hypercubes, the interconnection topology can comprise a plurality of clusters and a plurality of links, with "n" being an integer greater than or equal to three. Each cluster has a degree "n," meaning that it is connected with links to "n" other clusters. The configurable connections can enable the bypassing of neighboring logical elements. In embodiments, some or all of the clusters in the fabric have a direct connection to a non-adjacent (non-neighboring) cluster. Within the fabric, each cluster of the plurality of clusters can have its own circular buffer. Therefore, the example diagram 300 includes a plurality of circular buffers. The plurality of circular buffers can have differing lengths. For example, the cluster 330 can have a circular buffer of length X, while the cluster 332 can have a circular buffer with a length of X+Y. In such a configuration, the cluster 330 sleeps after execution of the X−1 stage until the cluster 332 executes the X+Y−1 stage, at which point the plurality of circular buffers having differing lengths can resynchronize with the zeroth pipeline stage for each of the plurality of circular buffers. In an example where X=6 and Y=2, after the execution of the fifth stage of FIG. 1 140, the cluster 330 sleeps until the cluster 332 executes the seventh stage, at which point both pipelines resynchronize and start executing the same stage together. The clusters (310-336) can be configured to function together to process data and produce a result. The result can be stored in one of the storage elements of a cluster. In some embodiments, the result is stored across multiple clusters. In embodiments, the switching fabric includes fan-in and fan-out connections. In embodiments, the storage elements store data while the configurable connections are busy with other data.

Figure 4:
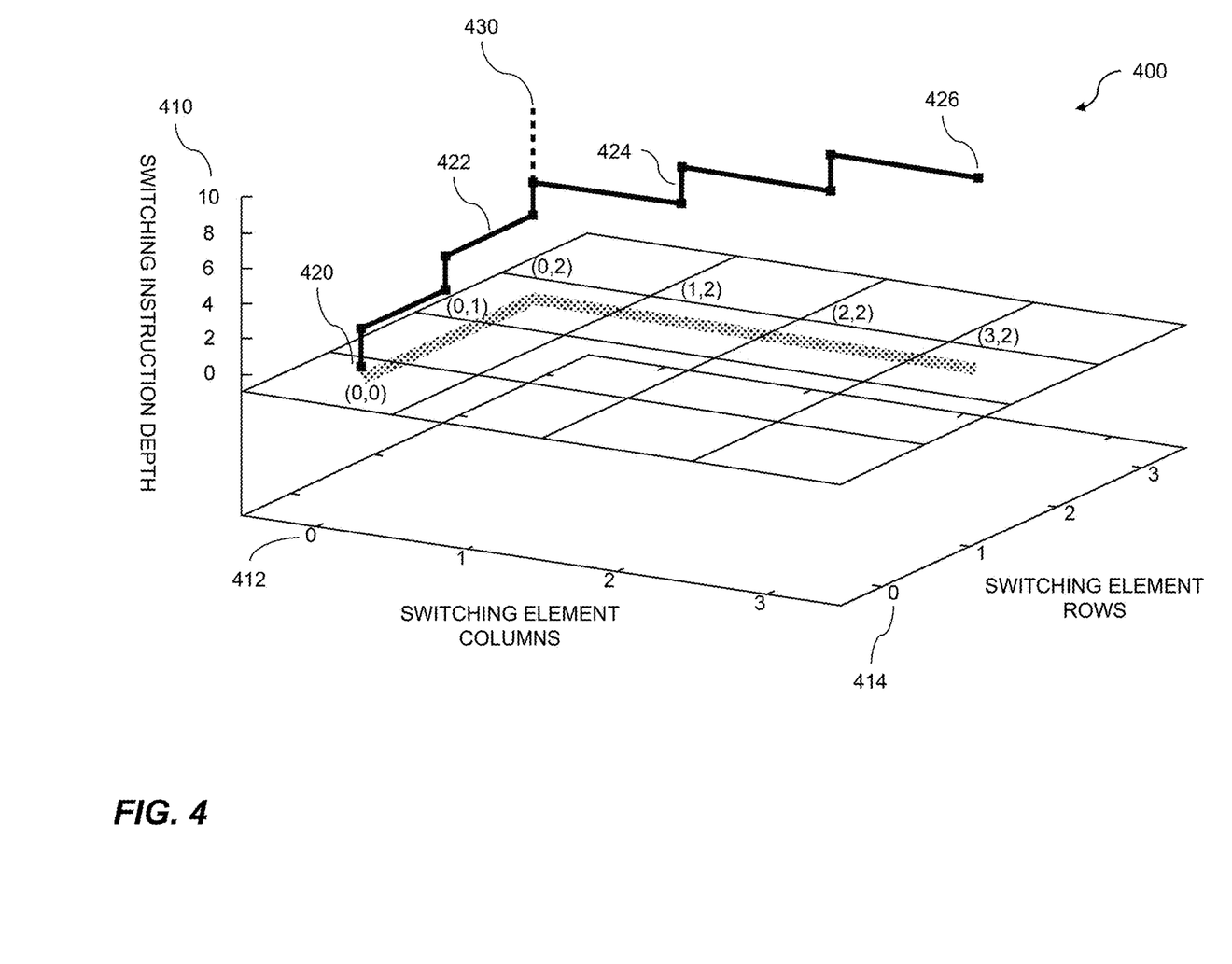
FIG. 4 shows example point-to-point routing.

FIG. 4 shows a chart 400 indicating an example point-to-point routing. The vertical axis 410 indicates switching instruction depth. The X axis 412 indicates switching element columns. The Y axis 414 indicates switching element rows. A curve 422 depicts an exemplary data transfer. The exemplary data transfer starts at the point (0, 0) 420, which in the example given represents the cluster 310 of FIG. 3. In the subsequent pipeline cycle, the data is transferred to another cluster, at the point (0, 1) on the graph, representing the cluster 320 of FIG. 3. In the subsequent pipeline cycle, the data is transferred to a third cluster, at the point (0, 2) on the graph, representing the cluster 330 of FIG. 3. In the subsequent pipeline cycle, the data is transferred to a fourth cluster, at the point (1, 2) on the graph, representing the cluster 332 of FIG. 3 and indicated by the point 424 in the chart 400. In the subsequent pipeline cycle, the data is transferred to a fifth cluster, at the point (2, 2) on the graph, representing the cluster 334 of FIG. 3. Finally, in the last pipeline cycle, the data is transferred to a sixth cluster, at the point (3, 2) on the graph, representing the cluster 336 of FIG. 3 and indicated by the point 426 in the chart 400. A vertical line 430 indicates a potential transfer delay. If a cluster is not ready to accept data, the data can be stored in a register (e.g. the register 240 of FIG. 2) for multiple cycles.

Figure 5:
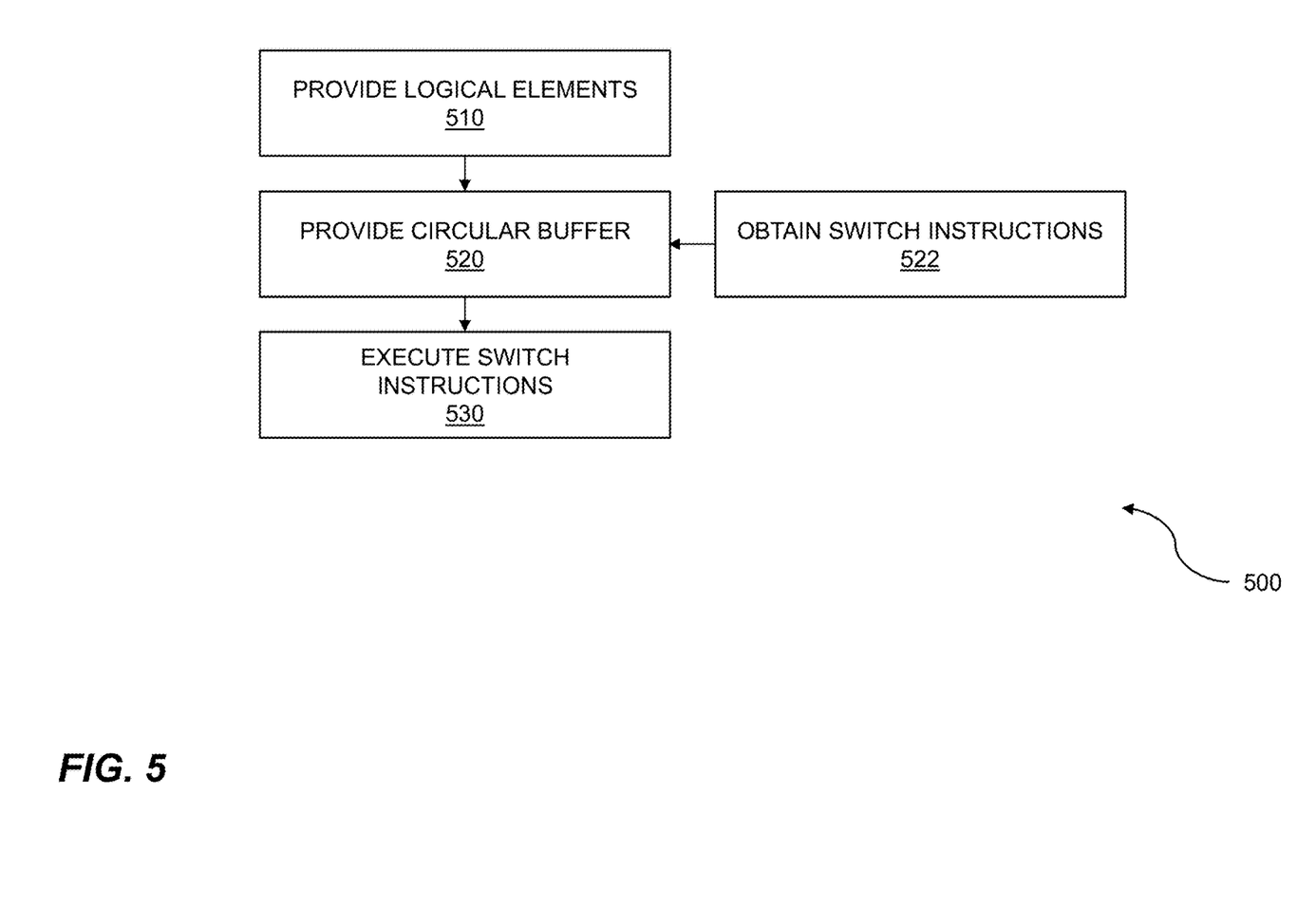
FIG. 5 is a flow diagram for implementing and using logic.

FIG. 5 is a flow diagram 500 for implementing and using logic. The flow comprises a computer-implemented method of logic implementation. The flow 500 can provide logical elements 510. The logical elements can include processing elements, storage elements, and switching elements. In embodiments, the logical elements are grouped into clusters. Each cluster can comprise one or more processing elements, storage elements, and switching elements. As shown, the flow 500 continues with providing a circular buffer 520. The circular buffer can have a length and a depth. The length can determine the number of pipeline stages, while the depth can determine the number of instructions per pipeline stage. In embodiments, the circular buffer provides between six and 12 pipeline stages, with a depth of three instructions. In embodiments, the circular buffer length is programmable. The programmability can be accomplished by providing additional circuitry, such as muxes, to configure the circular buffer to a desired length. The circular buffer can be programmed and instructions can be preprocessed to generate input to the circular buffer for dynamic programming. The flow 500 continues with obtaining switch instructions 522. The switch instructions can be obtained from a preprocessor and/or compiler which generates the switch instructions for the implementation of a particular function. The switch instructions can be loaded into the circular buffer. The flow 500 continues with executing the switch instructions 530. The switch instructions can be loaded into switching elements within the clusters to configure connections to other clusters such that data can be transferred between and among the clusters. The flow can include designing a switching fabric using a plurality of logical elements, configurable connections between and among the logical elements, and a circular buffer controlling the configurable connections.

In embodiments, a computer-implemented method of logic implementation comprising: designing a switching fabric using: a plurality of logical elements; configurable connections between and among the plurality of logical elements; and a plurality of rotating circular buffers residing on a semiconductor chip where the plurality of circular buffers contain configuration instructions which control different configurable connections between and among the plurality of logical elements and dynamically change operation of the logical elements based on the rotating of a circular buffer within the plurality of circular buffers, wherein the rotating of the circular buffer within the plurality of rotating circular buffers enables two or more logic functions to be implemented in run time.

Figure 6:
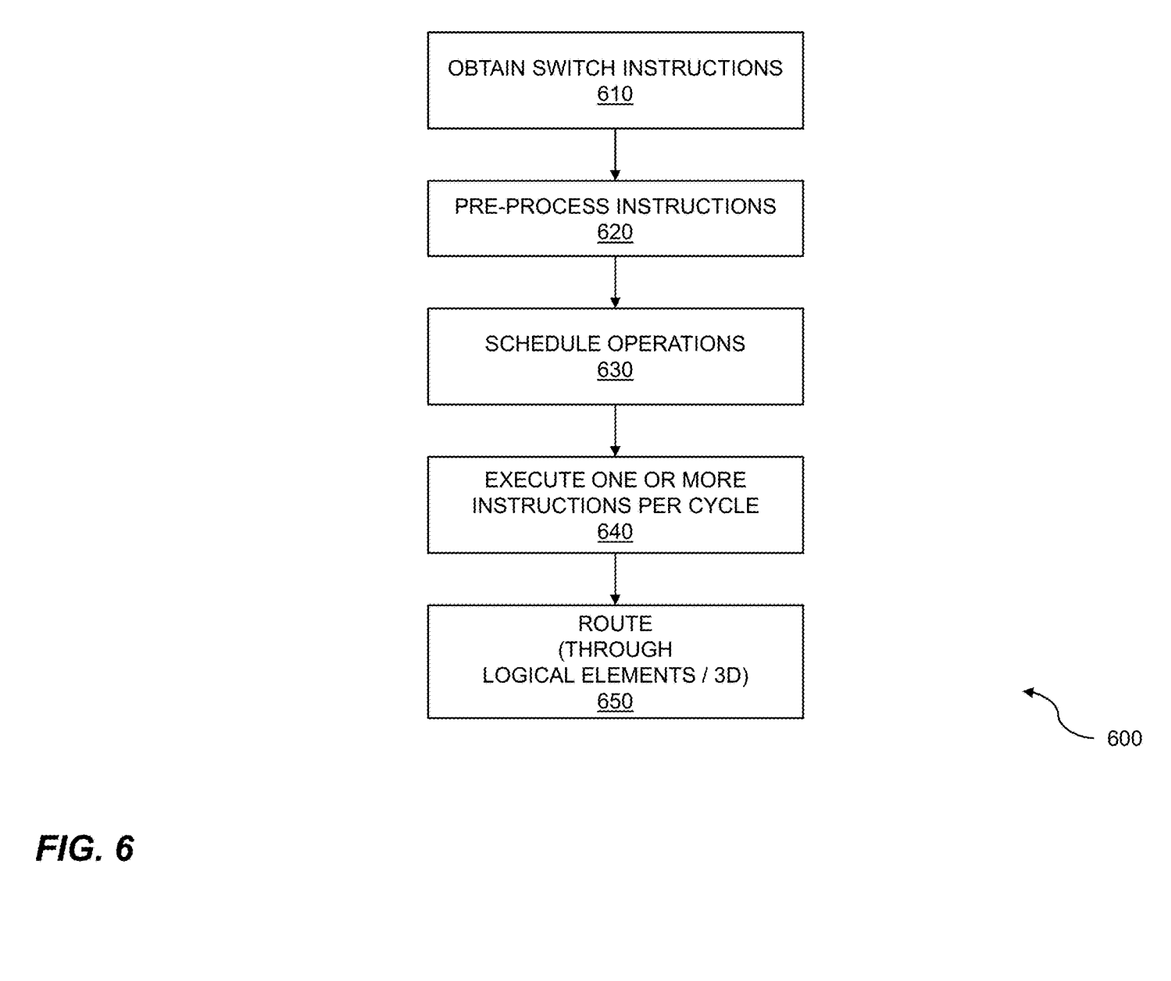
FIG. 6 is a flow diagram for the programming and use of a circular buffer.

FIG. 6 is a flow diagram 600 for the programming and use of a circular buffer. The flow 600 includes obtaining switch instructions 610. The switch instructions can be obtained from a computer system executing a compiler. The flow 600 continues with preprocessing the instructions 620. In embodiments, the preprocessing includes conflict checking. The flow 600 continues with scheduling operations 630. The flow 600 continues with executing one or more instructions per cycle 640. The order in which operations are placed in a circular buffer can determine the order of execution of the instructions. For example, the instructions 176 and 178 of FIG. 1 can be next in line to be executed by the switching element 112 of the same figure, followed by the execution of the instructions 172 and 174. The instructions 176 and 178 can be executed in parallel. Similarly, the instructions 172 and 174 can also be executed in parallel. The plurality of switch instructions per cycle can be mutually exclusive. The flow 600 continues with routing data through logical elements 650.

Figure 7:
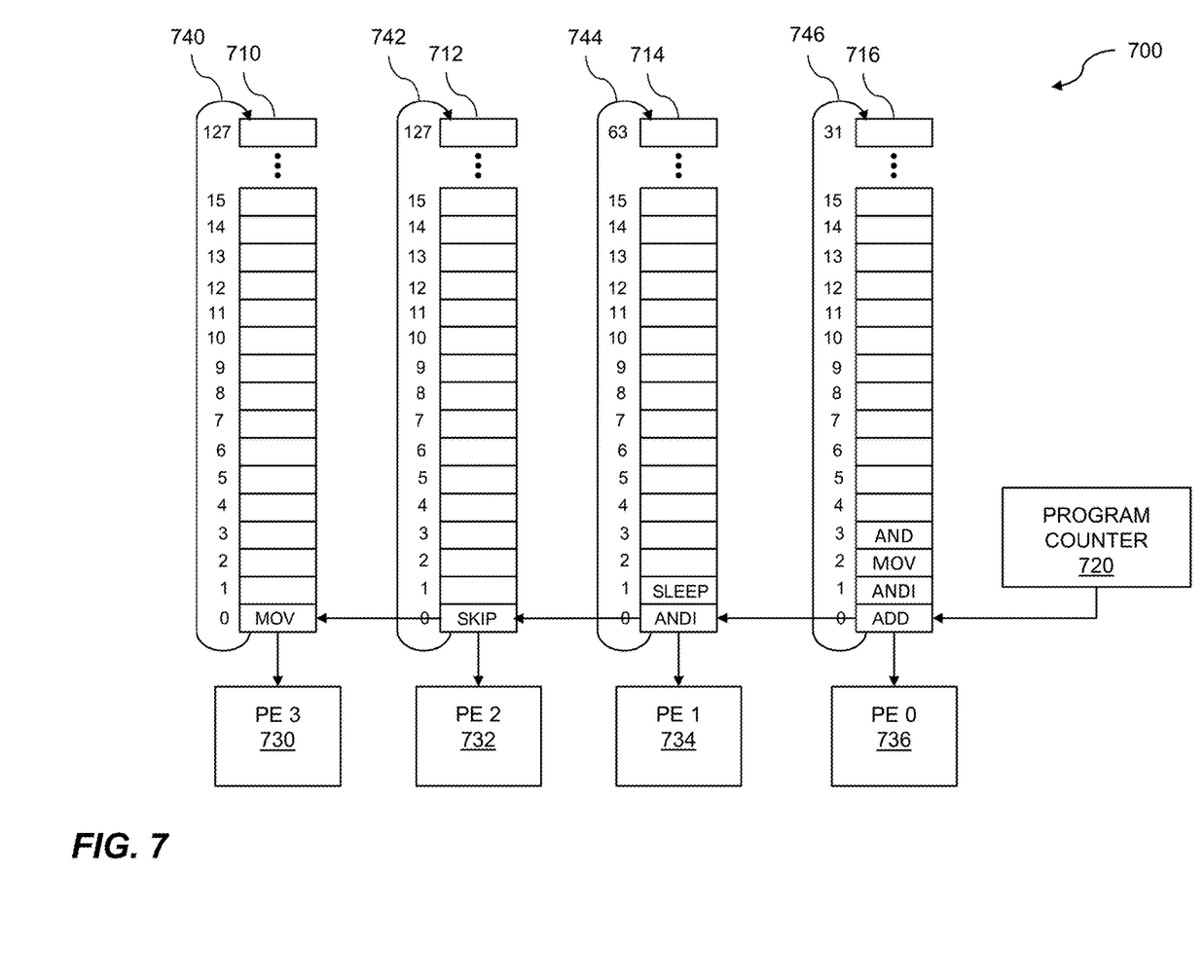
FIG. 7 illustrates circular buffers and processing elements.

FIG. 7 illustrates circular buffers and processing elements. A diagram 700 indicates example instruction execution for processing elements. The processing elements can include a portion of or all of the elements within a reconfigurable fabric. The instruction execution can include instructions for reconfigurable fabric data routing. A plurality of kernels is allocated across a reconfigurable fabric which includes a plurality of clusters, where the plurality of kernels includes at least a first kernel and a second kernel. The clusters can include processing elements, switching elements, storage elements, and so on. The first kernel is mounted in a first set of clusters, and a second kernel is mounted in a second set of clusters. Available routing is determined through the second set of clusters. A porosity map through the second set of clusters is calculated based on the available routing through the second set of clusters. Data is sent through the second set of clusters to the first set of clusters based on the porosity map. The available routing through the second set of clusters can change during execution of the second kernel.

A circular buffer 710 feeds a processing element 730. A second circular buffer 712 feeds another processing element 732. A third circular buffer 714 feeds another processing element 734. A fourth circular buffer 716 feeds another processing element 736. The four processing elements 730, 732, 734, and 736 can represent a quad of processing elements. In embodiments, the processing elements 730, 732, 734, and 736 are controlled by instructions received from the circular buffers 710, 712, 714, and 716. The circular buffers can be implemented using feedback paths 740, 742, 744, and 746, respectively. In embodiments, the circular buffer can control the passing of data to a quad of processing elements through switching elements, where each of the quad of processing elements is controlled by four other circular buffers (as shown in the circular buffers 710, 712, 714, and 716) and where data is passed back through the switching elements from the quad of processing elements where the switching elements are again controlled by the main circular buffer. In embodiments, a program counter 720 is configured to point to the current instruction within a circular buffer. In embodiments with a configured program counter, the contents of the circular buffer are not shifted or copied to new locations on each instruction cycle. Rather, the program counter 720 is incremented in each cycle to point to a new location in the circular buffer. The circular buffers 710, 712, 714, and 716 can contain instructions for the processing elements. The instructions can include, but are not limited to, move instructions, skip instructions, logical AND instructions, logical AND-Invert (e.g. ANDI) instructions, logical OR instructions, mathematical ADD instructions, shift instructions, sleep instructions, and so on. A sleep instruction can be usefully employed in numerous situations. The sleep state can be entered by an instruction within one of the processing elements. One or more of the processing elements can be in a sleep state at any given time. In some embodiments, a "skip" can be performed on an instruction and the instruction in the circular buffer can be ignored and the corresponding operation not performed.

In some embodiments, the circular buffers 710, 712, 714, and 716 could all have the same length, for example, 128 instructions. However, in other embodiments, the plurality of circular buffers can have differing lengths. That is, the plurality of circular buffers can comprise circular buffers of differing sizes. As shown in FIG. 7, the first two circular buffers 710 and 712 have a length of 128 instructions, the third circular buffer 714 has a length of 64 instructions, and the fourth circular buffer 716 has a length of 32 instructions, but other circular buffer lengths are also possible. The plurality of circular buffers that have differing lengths can resynchronize with a zeroth pipeline stage for each of the plurality of circular buffers. The circular buffers of differing sizes can restart at a same time step. In other embodiments, the plurality of circular buffers includes a first circular buffer repeating at one frequency and a second circular buffer repeating at a second frequency. In this situation, the first circular buffer is of one length. When the first circular buffer finishes through a loop, it can restart operation at the beginning, even though the second, longer circular buffer has not yet completed its operations. When the second circular buffer reaches completion of its loop of operations, the second circular buffer can restart operations from its beginning.

As can be seen in FIG. 7, different circular buffers can have different instruction sets within them. For example, the first circular buffer 710 contains a MOV instruction. The second circular buffer 712 contains a SKIP instruction. The third circular buffer 714 contains a SLEEP instruction and an ANDI instruction. The fourth circular buffer 716 contains an AND instruction, a MOVE instruction, an ANDI instruction, and an ADD instruction. The operations performed by the processing elements 730, 732, 734, and 736 are dynamic and can change over time, based on the instructions loaded into the respective circular buffers. As the circular buffers rotate, new instructions can be executed by the respective processing element.

Figure 8:
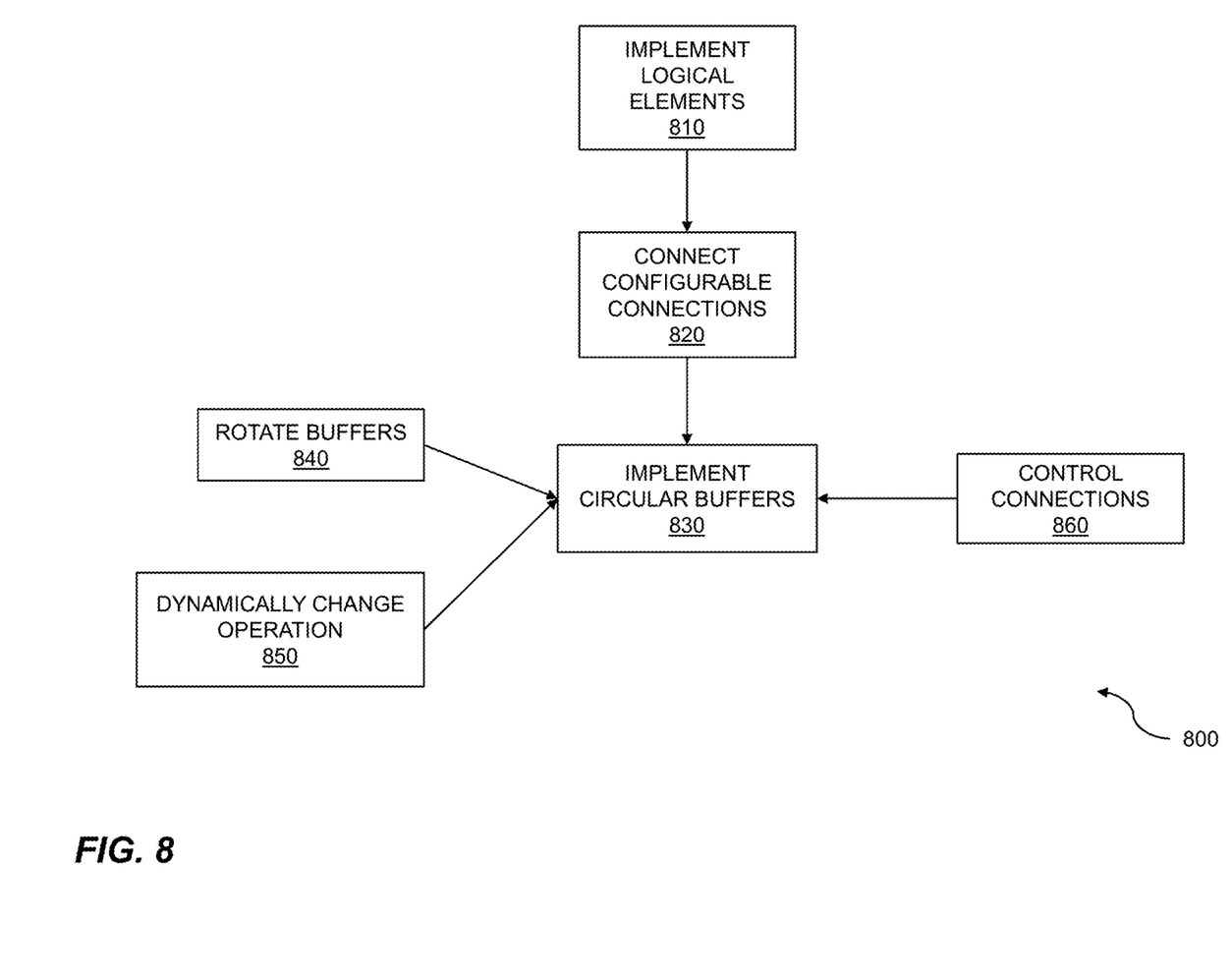
FIG. 8 is a flow diagram for reconfigurable fabric design.

FIG. 8 is a flow diagram for reconfigurable fabric design. The reconfigurable fabric can be designed using logical elements, configurable connections between and among the logical elements, and rotating circular buffers. The circular buffers contain configuration instructions. The configuration instructions control connections between and among logical elements. The logical elements change operation based on the instructions that rotate through the circular buffers. The logical elements, the configurable connections, and the rotating circular buffers comprise a reconfigurable fabric. The flow 800, or portions thereof, can be implemented in semiconductor logic, can be accomplished using a mobile device, can be accomplished using a server device, and so on. The flow 800 includes implementing logical elements 810. The logical elements can include processing elements, switching elements, and storage, or memory, elements. The logical elements can be the building blocks on which a reconfigurable fabric is implemented. The logical elements can be controlled by circular buffers. Each logical element of a plurality of logical elements can be controlled by its own circular buffer. In some embodiments, more than one logical element from the plurality of logical elements can be controlled by the same circular buffer.

The flow 800 includes connecting configurable connections 820 between and among the plurality of logical elements. It should be understood that generally, connections go point-to-point between two logical elements of the plurality of logical elements. However, in embodiments, the connections may be among three or more logical elements of the plurality of logical elements. The connections can be implemented using switching elements. The connections implemented using a switching element can be configured to connect different logical elements based on control instructions from a circular buffer that controls the switching element. In embodiments, other logical elements besides switching elements implement the connections. The flow 800 includes implementing circular buffers 830. The circular buffers can be statically scheduled. The circular buffers can include rotating the buffers 840 to change instructions that control the configurable connections. The rotating circular buffers enable changing operation dynamically 850 of the connections between and among the logical elements. Thus the rotating circular buffers control the connections 860 within the reconfigurable fabric. The connections can be controlled to avoid collisions among the various data traveling through the reconfigurable fabric. The circular buffer instructions that control the connections can be preprocessed to prevent collisions. The circular buffers can be statically scheduled.

The flow 800 can describe a computer-implemented method of designing a reconfigurable fabric comprising: implementing a plurality of logical elements; connecting configurable connections between and among the plurality of logical elements; and implementing a plurality of rotating circular buffers residing on a semiconductor chip where the plurality of rotating circular buffers contain configuration instructions which control different configurable connections between the plurality of logical elements and dynamically change operation of the logical elements based on the rotating of a circular buffer within the plurality of rotating circular buffers. Various steps in the flow 800 may be changed in order, repeated, omitted, or the like without departing from the disclosed concepts. Various embodiments of the flow 800 can be included in a computer program product embodied in a non-transitory computer readable medium that includes code executable by one or more processors. Various embodiments of the flow 800, or portions thereof, can be included on a semiconductor chip and implemented in special purpose logic, programmable logic, and so on.

Figure 9:
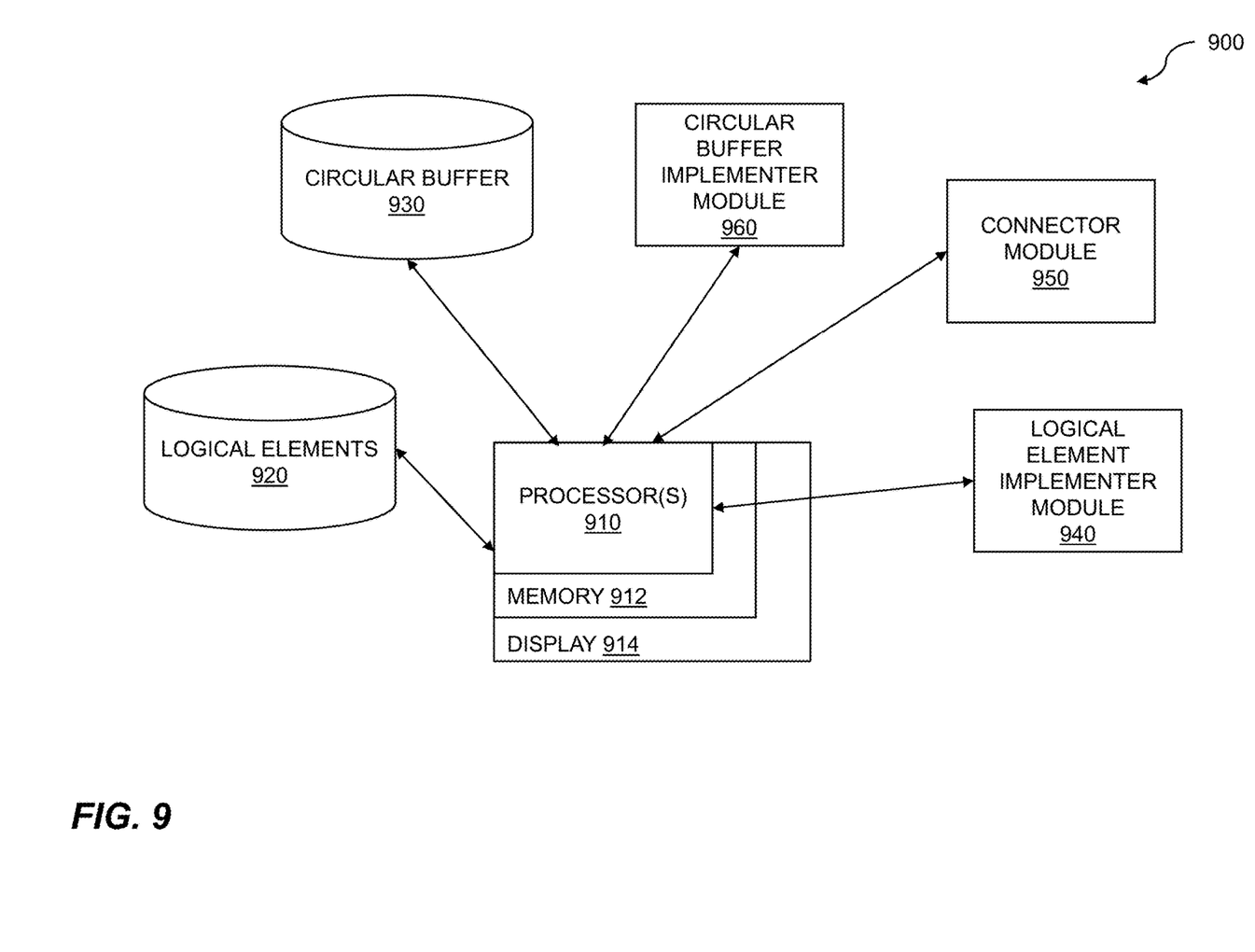
FIG. 9 is a system diagram for reconfigurable fabric design.

FIG. 9 is a system diagram for reconfigurable fabric design. The system 900 includes one or more processors 910 and a memory 912. The memory 912 can be used for storing instructions, for storing circuit designs, for storing logic designs, for system support, and the like. The one or more processors 910 can read in information regarding logical elements 920 and a circular buffer 930, and implement various programmable logic designs using a logical element implementer module 940, a connector module 950, and a circular buffer implementer module 960. Logical elements can be represented in the form of digital data stored on a storage medium such as a hard disk. The digital data can be in the form of a library or a database. The library or database can comprise a plurality of standard designs. Similarly, the circular buffer 930 can be represented in the form of digital data stored on a storage medium such as a hard disk. The circular buffer digital data can also be in the form of a library or database. In at least one embodiment, the functions for the logical element implementer module 940, connector module 950, and circular buffer implementer module 960 are accomplished by the one or more processors 910.

In embodiments, one or more of the logical elements 920, circular buffer 930, implementer module 940, connector module 950, and circular buffer implementer module 960 are interconnected via the Internet. Cloud computing can be used to design the switching fabric and plurality of logical elements. Information about the various designs can be shown on a display 914 which is attached to the one or more processors 910. The display 914 can be any electronic display, including but not limited to, a computer display, a laptop screen, a netbook screen, a tablet screen, a cell phone display, a mobile device display, a remote with a display, a television, a projector, and the like.

The system 900 can include a computer program embodied in a non-transitory computer readable medium for implementation of a reconfigurable fabric, the computer program comprising code which configures one or more processors to perform operations of: designing a reconfigurable fabric by: implementing a plurality of logical elements; connecting configurable connections between and among the plurality of logical elements; and implementing a plurality of rotating circular buffers residing on a semiconductor chip where the plurality of rotating circular buffers contain configuration instructions which control different configurable connections between and among the plurality of logical elements and dynamically change operation of the logical elements based on the rotating of a circular buffer within the plurality of rotating circular buffers.

The system 900 can comprise a computer system for implementation of a reconfigurable fabric comprising: a memory which stores instructions; and one or more processors coupled to the memory, wherein the one or more processors are configured to: design a reconfigurable fabric by: implementing a plurality of logical elements; connecting configurable connections between the plurality of logical elements; and implementing a plurality of rotating circular buffers residing on a semiconductor chip where the plurality of rotating circular buffers contain configuration instructions which control different configurable connections between and among the plurality of logical elements and dynamically change operation of the logical elements based on the rotating of a circular buffer within the plurality of rotating circular buffers.

Each of the above methods may be executed on one or more processors on one or more computer systems. Embodiments may include various forms of distributed computing, client/server computing, and cloud-based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above-mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are limited to neither conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the foregoing examples should not limit the spirit and scope of the present invention; rather it should be understood in the broadest sense allowable by law.

What is claimed is:

1. A computer-implemented method of designing a reconfigurable fabric comprising:
   implementing a plurality of logical elements;
   connecting configurable connections between and among the plurality of logical elements; and
   implementing a plurality of rotating circular buffers residing on a semiconductor chip where the plurality of rotating circular buffers contain configuration instructions which control different configurable connections between and among the plurality of logical elements and dynamically change operation of the logical elements based on the rotating of a circular buffer within the plurality of rotating circular buffers, wherein the plurality of rotating circular buffers have differing lengths and resynchronize with a zeroth pipeline stage for each of the plurality of rotating circular buffers.

2. The method of claim 1 wherein the rotating of the circular buffer within the plurality of rotating circular buffers enables two or more logic functions to be implemented in run time.

3. The method of claim 1 wherein the configuration instructions are preprocessed by a compiler and statically scheduled to avoid collisions among the plurality of logical elements.

4. The method of claim 3 wherein the preprocessing inserts further instructions to prevent the collisions.

5. The method of claim 4 wherein the further instructions include one or more of storage instructions, sleep instructions, or no-op instructions.

6. The method of claim 3 further comprising replacing multiple instructions with a single fan-in instruction in preprocessing.

7. The method of claim 1 wherein the configurable connections are time multiplexed.

8. The method of claim 1 wherein the circular buffer within the plurality of rotating circular buffers is programmed and instructions are preprocessed to generate input to the circular buffer within the plurality of rotating circular buffers for dynamic programming.

9. The method of claim 1 wherein the circular buffer within the plurality of rotating circular buffers controls passing data to a quad of processing elements through switching elements, where each of the quad of processing elements is controlled by four other circular buffers, where data is passed back through the switching elements from the quad of processing elements where the switching elements are again controlled by the circular buffer within the plurality of rotating circular buffers.

10. The method of claim 1 wherein a column within the circular buffer within the plurality of rotating circular buffers can be skipped in a cycle.

11. The method of claim 10 wherein not skipping indicates a valid instruction.

12. The method of claim 1 wherein the plurality of logical elements includes a processing element that can be placed in a sleep state where the sleep state is exited based on data being valid.

13. The method of claim 12 wherein the sleep state can be entered by an instruction within the processing element.

14. The method of claim 12 wherein the processing element wakes up from the sleep state when valid data is applied to inputs of the processing element.

15. The method of claim 14 wherein the sleep state can only be exited by stimulus external to the processing element and not based on programming of the processing element.

16. The method of claim 15 wherein the sleep state is exited based on an instruction applied to a switching fabric.

17. The method of claim 1 wherein the configurable connections provide three-dimensional routing.

18. The method of claim 1 further comprising storage elements coupled to the configurable connections wherein the storage elements include one or more of registers, caches, or on-chip memories.

19. The method of claim 18 wherein the storage elements store data while the configurable connections are busy with other data.

20. The method of claim 1 wherein the configurable connections enable bypassing of neighboring logical elements.

21. The method of claim 1 wherein communication through the configurable connections is based on data being valid.

22. The method of claim 1 where collisions are avoided by intermediate data being stored in registers for pipeline cycles before being sent to an output port for a cluster.

23. A computer program embodied in a non-transitory computer readable medium for implementation of a reconfigurable fabric, the computer program comprising code which configures one or more processors to perform operations of:
   designing a reconfigurable fabric by:
      implementing a plurality of logical elements;
      connecting configurable connections between and among the plurality of logical elements; and
      implementing a plurality of rotating circular buffers residing on a semiconductor chip where the plurality of rotating circular buffers contain configuration instructions which control different configurable connections between and among the plurality of logical elements and dynamically change operation of the logical elements based on the rotating of a circular buffer within the plurality of rotating circular buffers, wherein the plurality of rotating circular buffers have differing lengths and resynchronize with a zeroth pipeline stage for each of the plurality of rotating circular buffers.

24. A computer system for implementation of a reconfigurable fabric comprising:

a memory which stores instructions; and
one or more processors coupled to the memory, wherein
the one or more processors are configured to:
design a reconfigurable fabric by:
implementing a plurality of logical elements;
connecting configurable connections between the plurality of logical elements; and
implementing a plurality of rotating circular buffers residing on a semiconductor chip where the plurality of rotating circular buffers contain configuration instructions which control different configurable connections between the plurality of logical elements and dynamically change operation of the logical elements based on the rotating of a circular buffer within the plurality of rotating circular buffers, wherein the plurality of rotating circular buffers have differing lengths and resynchronize with a zeroth pipeline stage for each of the plurality of rotating circular buffers.

* * * * *